US009439313B2

United States Patent
Yu

(10) Patent No.: US 9,439,313 B2
(45) Date of Patent: Sep. 6, 2016

(54) HOLDING DEVICE ADAPTED TO CASING OF ELECTRONIC DEVICE AND ELECTRONIC DEVICE THEREWITH

(71) Applicant: Wistron Corporation, New Taipei (TW)

(72) Inventor: Cheng-Tsung Yu, New Taipei (TW)

(73) Assignee: Wistron Corporation, New Taipei (TW)

( * ) Notice: Subject to any disclaimer, the term of this patent is extended or adjusted under 35 U.S.C. 154(b) by 85 days.

(21) Appl. No.: 14/279,328

(22) Filed: May 16, 2014

(65) Prior Publication Data

US 2015/0237754 A1 Aug. 20, 2015

(30) Foreign Application Priority Data

Feb. 19, 2014 (TW) .............................. 103105546 A

(51) Int. Cl.
*H05K 5/00* (2006.01)
*H05K 5/02* (2006.01)
*G06F 1/16* (2006.01)

(52) U.S. Cl.
CPC ........... *H05K 5/0286* (2013.01); *G06F 1/1613* (2013.01); *G06F 1/1658* (2013.01); *H05K 5/0013* (2013.01); *H05K 5/0217* (2013.01)

(58) Field of Classification Search
CPC ........... H04B 1/3816; H04M 2250/14; G06F 1/1658; G06F 1/183; G06F 1/187; H05K 5/0282; H05K 5/0286; G06K 7/0034
See application file for complete search history.

(56) References Cited

U.S. PATENT DOCUMENTS

| 9,106,310 B2* | 8/2015 | Dondzik .............. H04B 1/3816 |
| 2010/0048120 A1 | 2/2010 | Chuang | |
| 2010/0314521 A1* | 12/2010 | Pauken .................. B60R 11/02 248/316.1 |
| 2011/0255252 A1* | 10/2011 | Sloey ................... H04B 1/3816 361/752 |
| 2014/0218877 A1 | 8/2014 | Wei | |

FOREIGN PATENT DOCUMENTS

TW M456008 6/2013

OTHER PUBLICATIONS

Office action mailed on Nov. 26, 2015 for the Taiwan application No. 103105546, filing date: Feb. 19, 2014, p. 1 line 12-14, p. 2-3 and p. 4 line 1-9.

\* cited by examiner

*Primary Examiner* — Robert J Hoffberg
*Assistant Examiner* — Hung Dang
(74) *Attorney, Agent, or Firm* — Winston Hsu; Scott Margo

(57) ABSTRACT

A holding device adapted to a casing of an electronic device is disclosed. The holding device includes a holding body and at least one tenon structure. The holding body is separately installed in an inserting slot on the casing. The at least one tenon structure protrudes from the holding body, and the at least one tenon structure is for providing a place for force to be applied, so as to activate the holding body to separate from the inserting slot. The at least one tenon structure is further for inserting into at least one engaging slot on the casing, so as to fix the holding body on the casing for holding an object.

19 Claims, 7 Drawing Sheets

HOLDING DEVICE ADAPTED TO CASING OF ELECTRONIC DEVICE AND ELECTRONIC DEVICE THEREWITH

BACKGROUND OF THE INVENTION

1. Field of the Invention

The present invention relates to a holding device and an electronic device therewith, and more particularly, to a holding device capable of being contained inside a casing and fixed outside the casing and an electronic device therewith.

2. Description of the Prior Art

Recently, a notebook computer has become one of the most common electronic products in people's daily life for dealing with documentation, emails or playing videos and so on. With development of the notebook computer industry, the notebook computer has been more powerful to deal with more affairs for people, leading to time that people use the notebook computer longer and longer. However, it is often boring when the notebook computer is utilized for dealing with daily affairs. Thus, designs of the notebook computer with more fun in use or with effects different from those mentioned above for increasing value of the notebook computer in the market have become an issue in the industry.

SUMMARY OF THE INVENTION

The present invention provides a holding device capable of being contained inside a casing and fixed outside the casing and an electronic device therewith for solving above drawbacks.

According to an embodiment of the present invention, a holding device adapted to a casing of an electronic device includes a holding body and at least one tenon structure. The holding body is separately installed in an inserting slot on the casing. The at least one tenon structure protrudes from the holding body, and the at least one tenon structure is for providing a place for force to be applied, so as to activate the holding body to separate from the inserting slot. The at least one tenon structure is further for inserting into at least one engaging slot on the casing, so as to fix the holding body on the casing for holding an object.

According to another embodiment of the present invention, a containing recess is formed on the holding body and for containing the object when the holding body is fixed on the casing.

According to another embodiment of the present invention, the containing recess is substantially a circular recess.

According to another embodiment of the present invention, the at least one tenon structure has a guiding structure for guiding the at least one tenon structure to insert into the at least one engaging slot.

According to another embodiment of the present invention, the guiding structure is a chamfer structure.

According to another embodiment of the present invention, the holding device further includes a plurality of sliding ribs disposed on the holding body and for guiding the holding body to slide into the inserting slot.

According to another embodiment of the present invention, at least one engaging structure is formed on the holding body for engaging with a connector fixed inside the casing when the holding body slides into the inserting slot, so as to fix the holding body in the inserting slot.

According to another embodiment of the present invention, an electronic device includes a casing whereon an inserting slot and at least one engaging slot are formed and a holding device including a holding body and at least one tenon structure. The holding body is separately installed in an inserting slot, and the at least one tenon structure protrudes from the holding body. The at least one tenon structure is for providing a place for force to be applied, so as to activate the holding body to separate from the inserting slot. The at least one tenon structure is further for inserting into at least one engaging slot on the casing, so as to fix the holding body on the casing for holding an object.

According to another embodiment of the present invention, the inserting slot is a memory card slot, and the holding body is a body of a memory card.

According to another embodiment of the present invention, the electronic device further includes a locking device disposed inside the casing and for locking the casing onto a fixing object.

According to another embodiment of the present invention, the locking device is a security lock whereon a locking slot corresponding to the at least one engaging slot is formed, and a contour of the at least one tenon structure substantially satisfies the locking slot.

According to another embodiment of the present invention, the at least one engaging slot is a plurality of thermal holes for dissipating thermal flows inside the casing.

According to another embodiment of the present invention, the holding device comprises a plurality of tenon structures for engaging with the plurality of thermal holes.

In summary, the holding body of the holding device of the present invention is able to insert into the inserting slot on the casing. Accordingly, the holding device of the present invention is able to be contained inside the casing as being not in use. Furthermore, the tenon structure of the holding device of the present invention is used for inserting into the engaging slot on the casing, so as to fix the holding body onto the casing. Accordingly, the holding body of the holding device of the present invention is able to hold the object, such as the aromatic container and so on, so as to enable the electronic device with fun as being in long term use and thus increase value of the electronic device in the market.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part hereof, and in which is shown by way of illustration specific embodiments in which the invention may be practiced. In this regard, directional terminology, such as "top," "bottom," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and "installed" and variations thereof herein are used broadly and encompass direct and indirect connections and installations. Accordingly, the drawings and descriptions will be regarded as illustrative in nature and not as restrictive.

Figure 1:
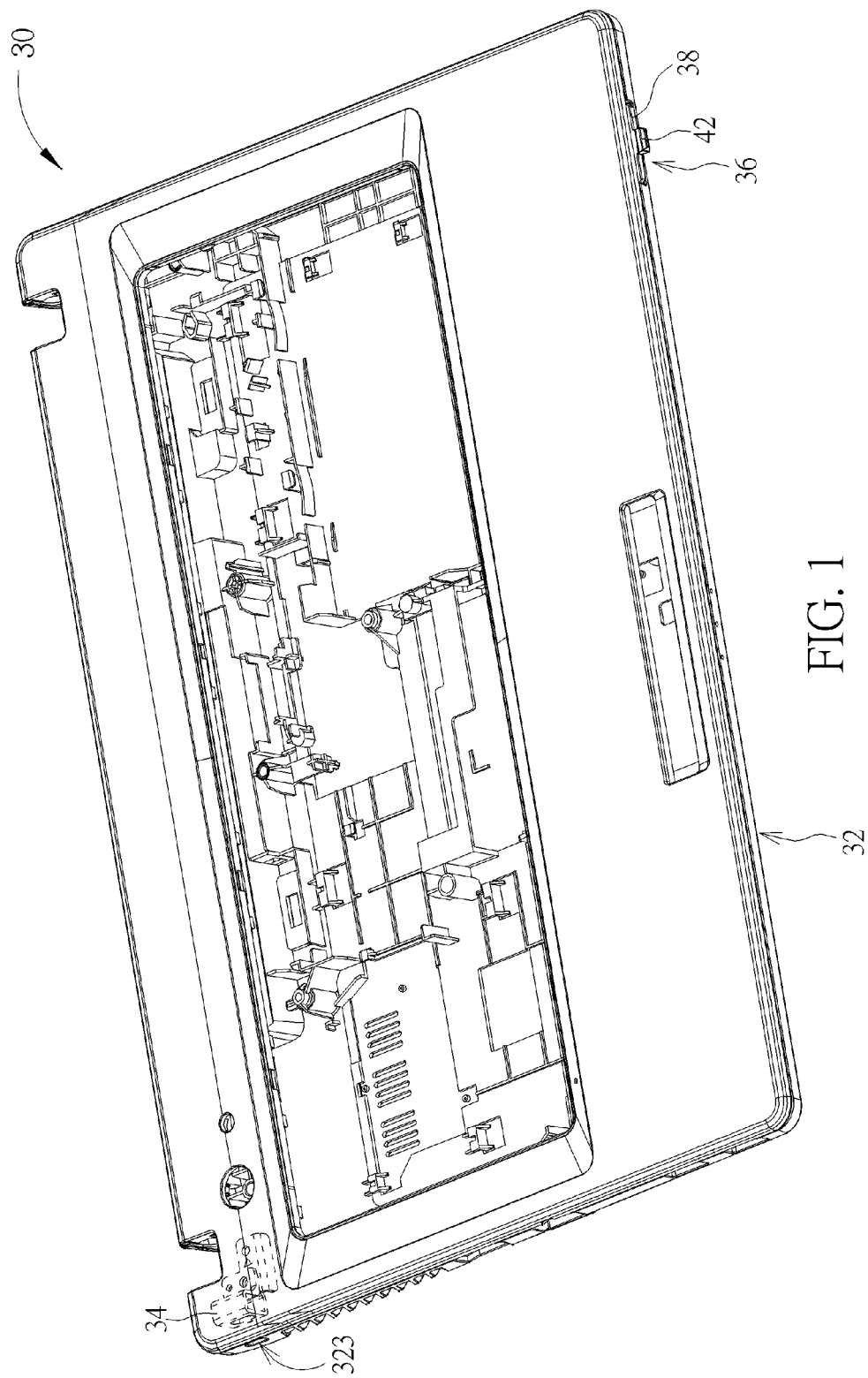
FIG. 1 is a schematic diagram of an electronic device according to an embodiment of the present invention.
Figure 2:
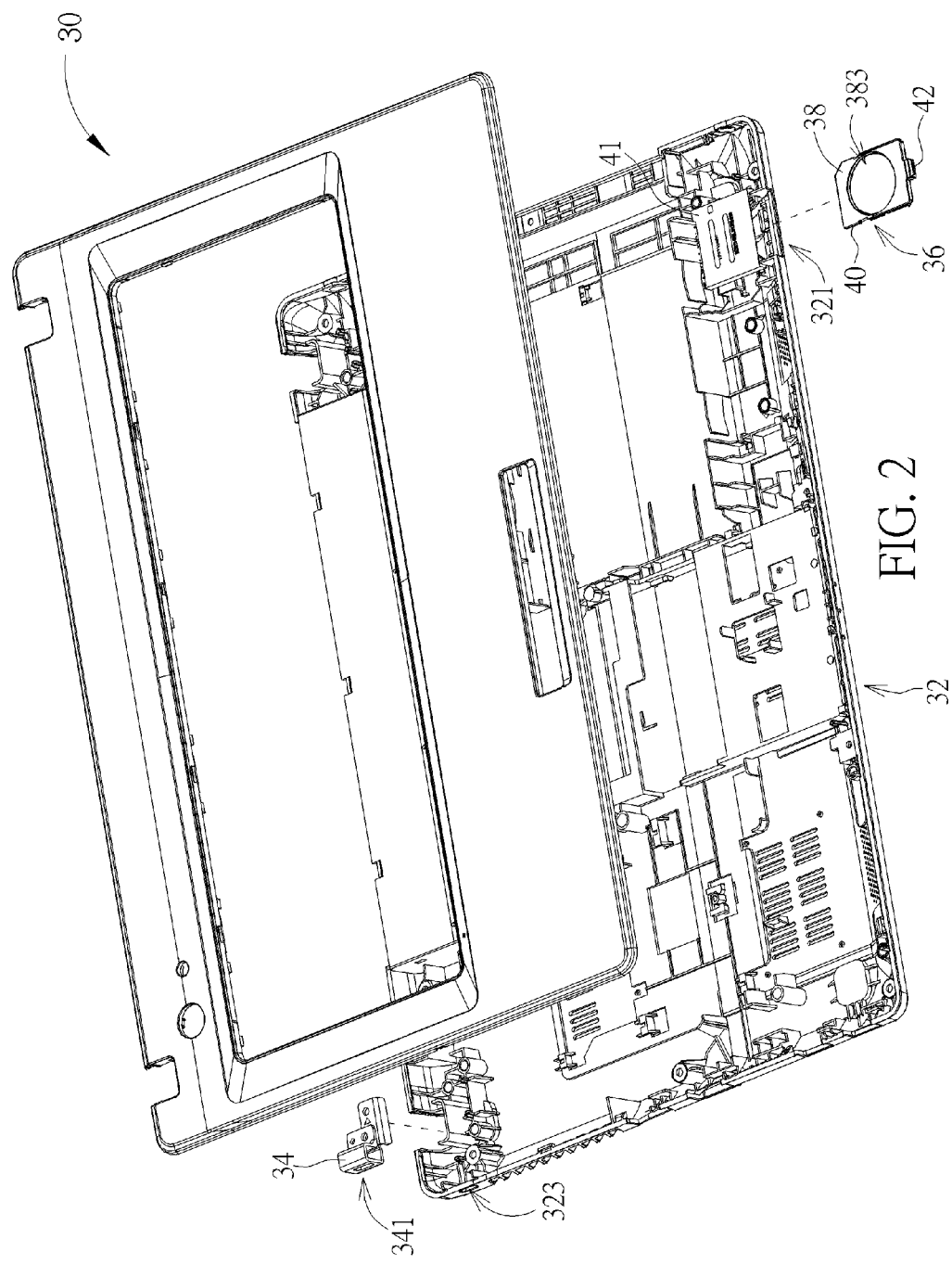
FIG. 2 is an exploded diagram of the electronic device according to the embodiment of the present invention.

Please refer to FIG. 1 and FIG. 2. FIG. 1 is a schematic diagram of an electronic device 30 according to an embodiment of the present invention. FIG. 2 is an exploded diagram of the electronic device 30 according to the embodiment of the present invention. As shown in FIG. 1 and FIG. 2, the electronic device 30 includes a casing 32 and a locking device 34. The locking device 34 is disposed inside the casing 32 and for locking the casing 32 onto a fixing object (not shown in figures), such as a ground, a desk and so on, so as to prevent the electronic device 30 from theft.

In this embodiment, the electronic device 30 is a host module of a notebook computer, and the locking device 34 is a security lock. Implementation of the electronic device 30 and the locking device 34 of the present invention is not limited to those illustrated in figures in this embodiment. Furthermore, an inserting slot 321 is formed on the casing 32, and the electronic device 30 further includes a holding device 36. The holding device 36 includes a holding body 38 separately installed in the inserting slot 321 on the casing 32. In this embodiment, the inserting slot 321 is a memory card slot, and the holding body 38 is a body of a memory card. For example, the holding body 38 can be a body of a Security Digital Memory Card (SD card), and the inserting slot 321 can be a Security Digital Memory Card slot. In other words, the holding device 36 of the present invention can be a dummy SD card, but the holding device 36 of the present invention is not limited thereto.

Figure 3:
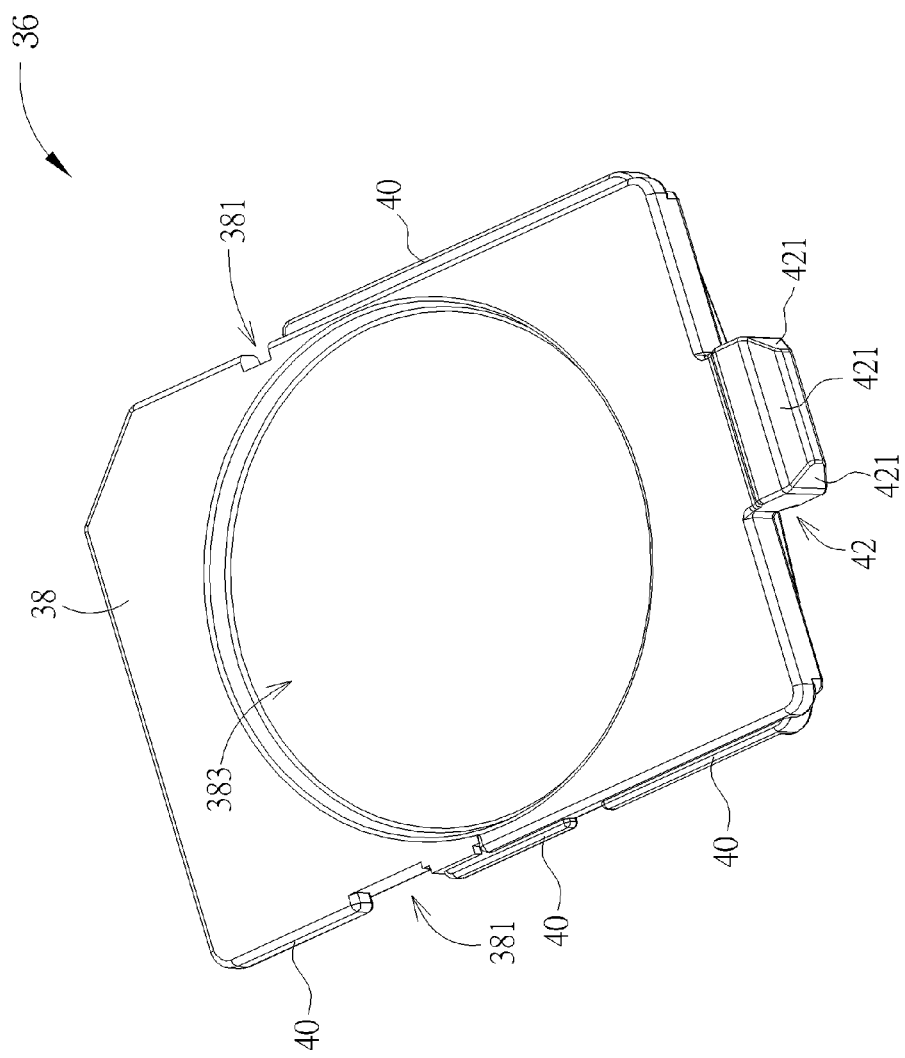
FIG. 3 is a diagram of a holding device according to the embodiment of the present invention.

Please refer to FIG. 2 and FIG. 3. FIG. 3 is a diagram of the holding device 36 according to the embodiment of the present invention. As shown in FIG. 2 and FIG. 3, the holding device 36 includes a plurality of sliding ribs 40 disposed on two sides of the holding body 38. The plurality of sliding ribs 40 are used for guiding the holding body 38 to slide into the inserting slot 321 on the casing 32, such that the holding body 38 inserts into the inserting slot 321 smoothly. An amount and position of the sliding rib 40 are not limited to those illustrated in figures in this embodiment, and it depends on practical demands. Furthermore, the electronic device 30 further includes a connector 41 fixed inside the casing 32, and at least one engaging structure 381 is formed on the holding body 38. When the holding body 38 of the holding device 36 slides into the inserting slot 321, the holding body 38 is inserted into the connector 41. Meanwhile, the engaging structure 381 on the holding body 38 can be used for engaging with the connector 41, so as to fix the holding body 38 in the inserting slot 321.

In this embodiment, the engaging structure 381 is an engaging slot, and structures of the engaging structure 381 of the present invention are not limited to those illustrated in figures in this embodiment. For example, the engaging structure 381 can be a hook as well. As for which one of the above-mentioned designs is adopted, it depends on practical demands. Further in this embodiment, there are two engaging structures 381 formed on the holding body 38 and located on the two sides of the holding body 38, respectively. An amount and position of the engaging structure 381 are not limited to those illustrated in figures in this embodiment. For example, there can be only one engaging structure 381 formed on the holding body 38 as well. In other words, structures of the holding body 38 with more than one engaging structure 381 are within the scope of the present invention.

As shown in FIG. 1 to FIG. 4, at least one engaging slot 323 is further formed on the casing 32, and a locking slot 341 corresponding to the engaging slot 323 is formed on the locking device 34 (i.e. the security lock). Furthermore, the holding device 36 further includes at least one tenon structure 42 protruding from the holding body 38. When the holding device 36 is in an inserting status shown in FIG. 1, the tenon structure 42 is exposed out of the casing 32 for providing a place for force to be applied, so as to facilitate a user to press the tenon structure 42. When the user press the tenon structure 42, the holding body 38 of the holding device 36 is capable of sliding relative to the connector 41, such that the engaging structure 381 on the holding body 38 releases from the connector 41. In such a manner, holding body 38 of the holding device 36 is able to separate from the inserting slot 321 on the casing 32.

Figure 4:
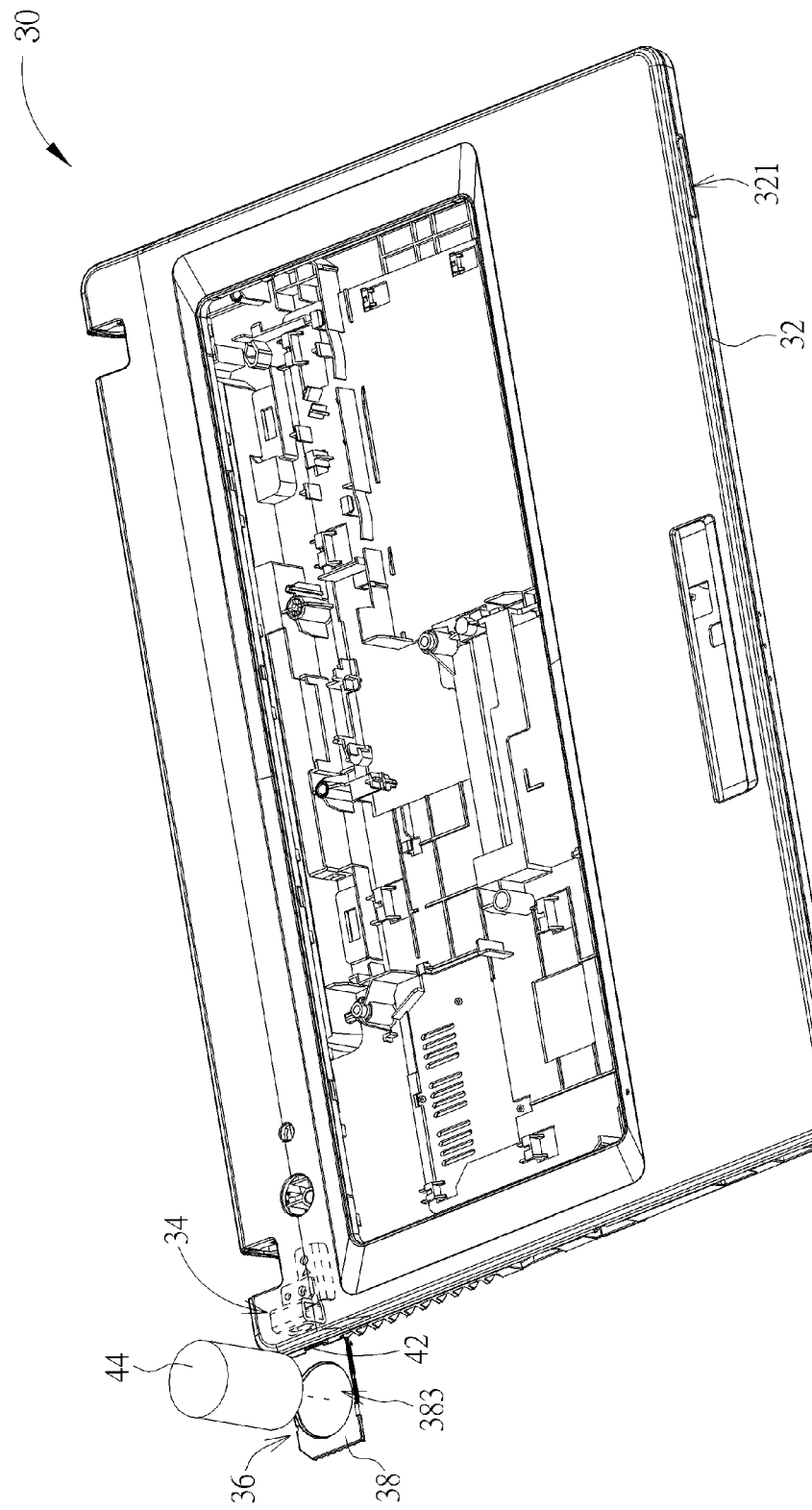
FIG. 4 is a diagram of the holding device in a loaded status according to the embodiment of the present invention.
Figure 5:
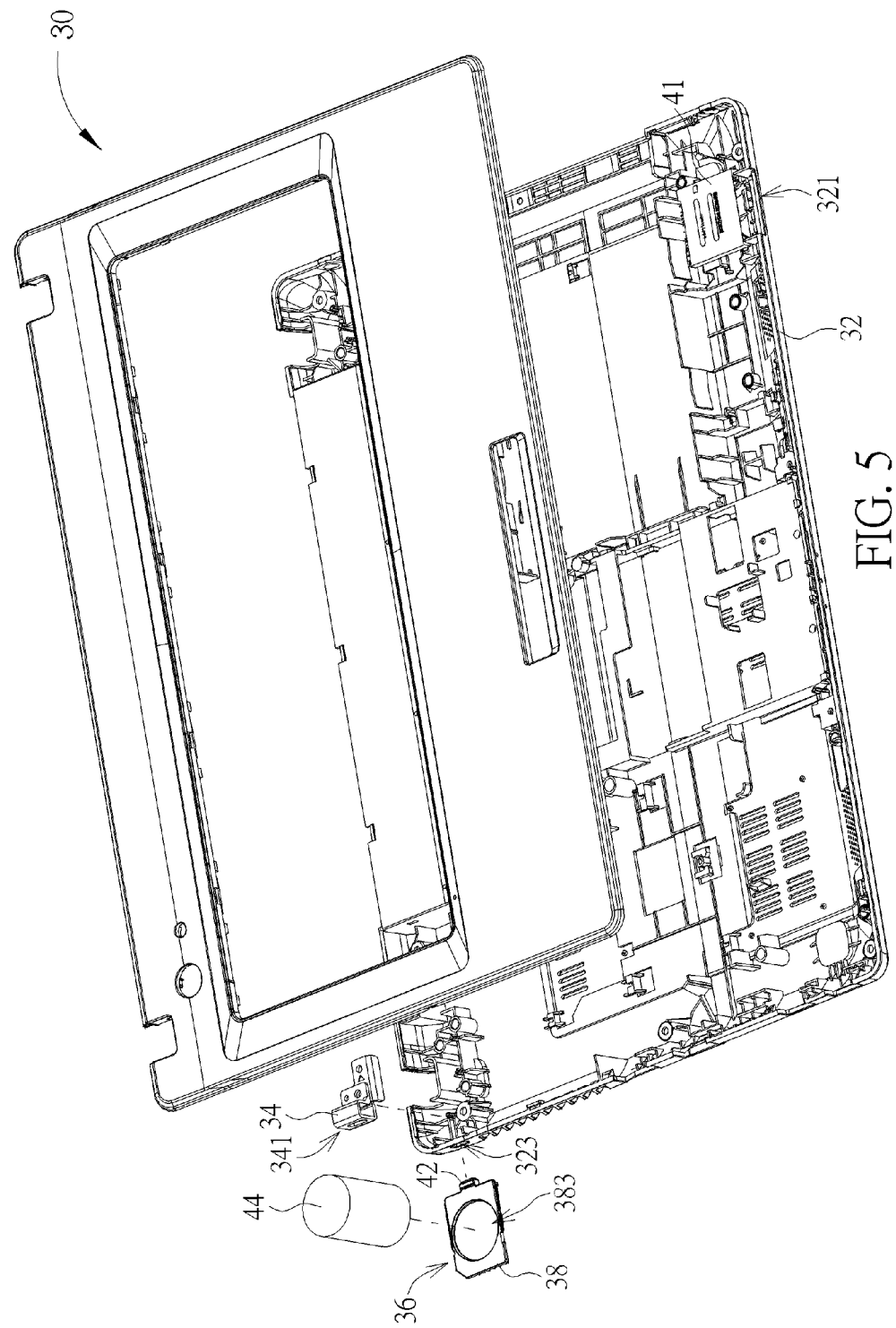
FIG. 5 is an exploded diagram of the holding device in the loaded status according to the embodiment of the present invention.

Please refer to FIG. 4 and FIG. 5. FIG. 4 is a diagram of the holding device 36 in a loaded status according to the embodiment of the present invention. FIG. 5 is an exploded diagram of the holding device 36 in the loaded status according to the embodiment of the present invention. As shown in FIG. 4 and FIG. 5, when the holding body 38 of the holding device 36 separates from the inserting slot 321 on the casing 32, the tenon structure 42 of the holding device 36 is able to insert into the engaging slot 323 on the casing 32. Accordingly, the tenon structure 42 can engage with the locking slot 341 on the locking device 34 (i.e. the security lock). In such a manner, the locking device 34 is able to fix the holding body 38 of the holding device 36 onto the casing 32, so as to make the holding body 38 of the holding device 36 to hold an object 44.

In this embodiment, the object 44 is an aromatic container, i.e. the holding body 38 of the holding device 36 can be used for holding the aromatic container, so as to enable the electronic device 30 with fun as being in long term use and thus it is able to increase value of the electronic device 30 in the market. Implementation of the holding device 36 of the present invention is not limited to those mentioned in this embodiment. Additionally, a containing recess 383 can be formed on the holding body 38 of the holding device 36. When the holding body 38 is fixed on the casing 32, the containing recess 383 is used for containing the object 44, such that the holding body 38 holds the object 44 more stably. In this embodiment, the containing recess 383 is substantially a circular recess.

Furthermore, a contour of the tenon structure 42 of the holding device 36 substantially satisfies the locking slot 341 on the locking device 34 (i.e. the security lock). Accordingly, the tenon structure 42 can engage with the locking slot 341 on the locking device 34 (i.e. the security lock) smoothly. Practically, the tenon structure 42 can be engaged with the locking slot 341 on the locking device 34 (i.e. the security lock) in a tight fit manner. Further in FIG. 3, the tenon structure 42 has at least one guiding structure 421 for guiding the tenon structure 42, such that the tenon structure 42 inserts into the engaging slot 323 on the casing 32 and the locking slot 341 on the locking device 34. In this embodiment, the guiding structure 421 is, but not limited to, a chamfer structure, e.g. the guiding structure 421 can be a rounded structure as well. As for which one of the above-mentioned designs is adopted, it depends on practical demands.

Figure 6:
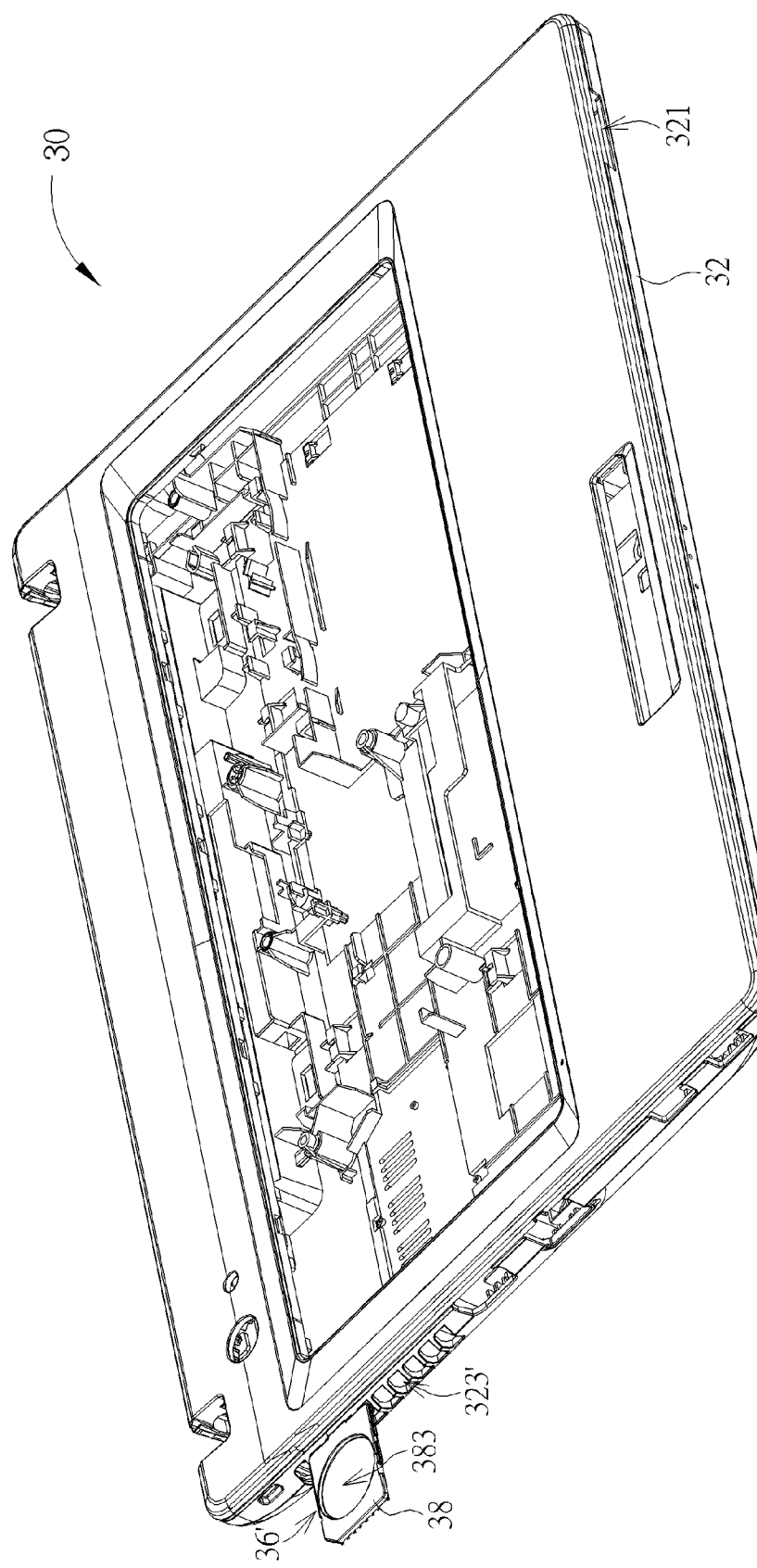
FIG. 6 is a diagram of a holding device in a loaded status according to another embodiment of the present invention.
Figure 7:
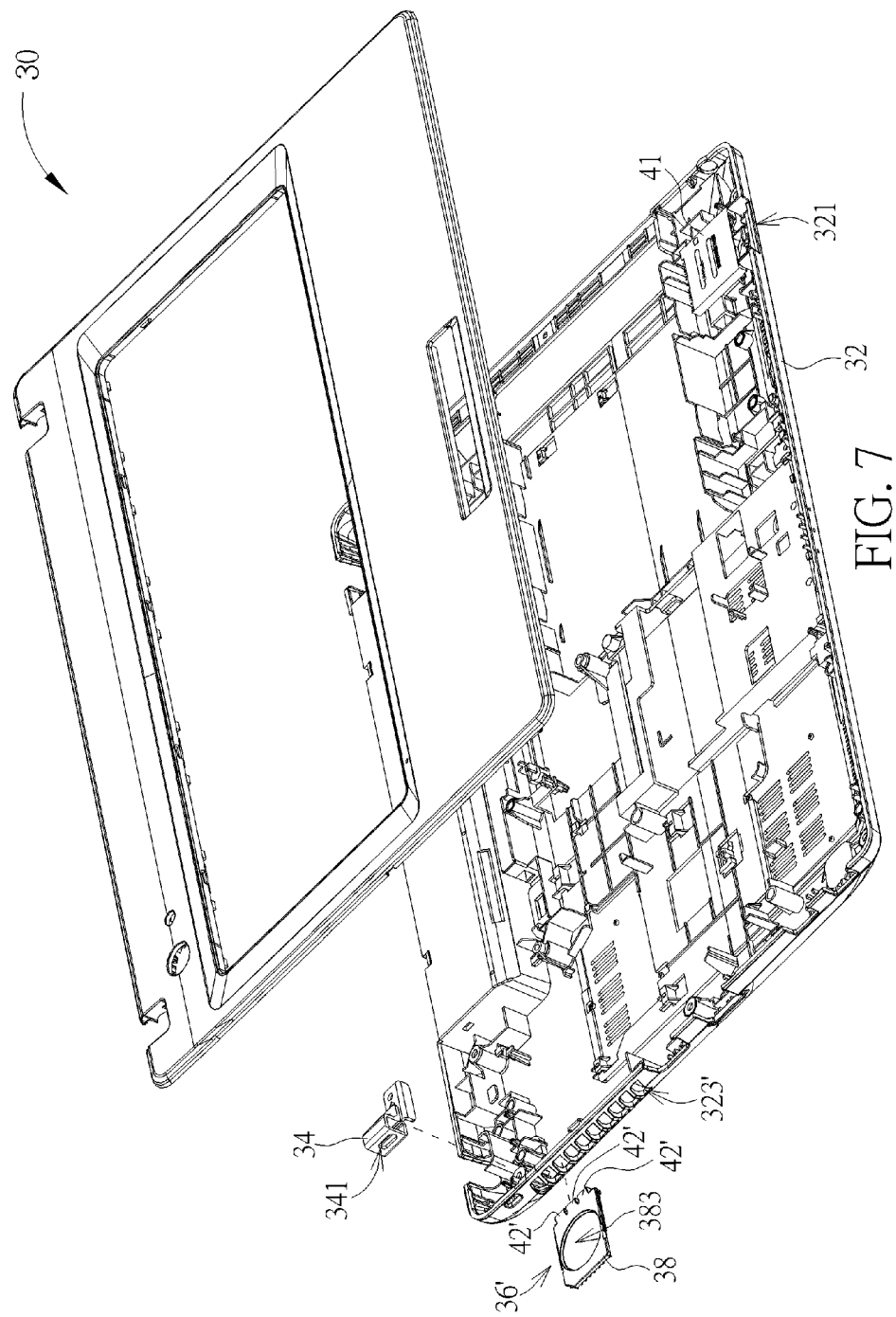
FIG. 7 is an exploded diagram of the holding device according to another embodiment of the present invention.

Please refer to FIG. 6 and FIG. 7. FIG. 6 is a diagram of a holding device 36' in a loaded status according to another embodiment of the present invention. FIG. 7 is an exploded diagram of the holding device 36' in the loaded status according to another embodiment of the present invention. As shown in FIG. 6 and FIG. 7, the major difference between the holding device 36' and the aforesaid holding device 36 is that the holding device 36' includes a plurality of tenon structures 42' for engaging with the plurality of thermal holes on the casing 32, correspondingly, so as to fix the holding body 38 of the holding device 36' onto the casing 32, i.e. in this embodiment, at least one engaging slot 323' can be the plurality of thermal holes for dissipating thermal flows inside the casing 32. The plurality of tenon structures 42' is inserted into and engaged with the plurality of thermal holes (i.e. the at least one engaging slot 323'), i.e. in this embodiment, the holding device 36' includes a plurality of tenon structures 42' in order for engaging with the plurality thermal holes (i.e. the engaging slot 323') for dissipating the thermal flows inside the casing 32. Components with denoted in this embodiment identical to those in the aforesaid embodiment have identical structures and functions, and further description is omitted herein for simplicity.

Compared to the prior art, the holding body of the holding device of the present invention is able to insert into the inserting slot on the casing. Accordingly, the holding device of the present invention is able to be contained inside the casing as being not in use. Furthermore, the tenon structure of the holding device of the present invention is used for inserting into the engaging slot on the casing, so as to fix the holding body onto the casing. Accordingly, the holding body of the holding device of the present invention is able to hold the object, such as the aromatic container and so on, so as to enable the electronic device with fun as being in long term use and thus increase value of the electronic device in the market.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A holding device adapted to a casing of an electronic device, comprising:
    a holding body separately installed in an inserting slot on the casing; and
    at least one tenon structure protruding from the holding body, the at least one tenon structure being for providing a place for force to be applied, so as to activate the holding body to separate from the inserting slot, the at least one tenon structure being further for inserting into at least one engaging slot on the casing, so as to fix and expose the holding body outside the casing for holding an object located outside the casing;
    wherein the inserting slot and the at least one engaging slot are both disposed in an interior of the casing, and the holding body is selectively disposed inside or outside of the casing.

2. The holding device of claim 1, wherein a containing recess is formed on the holding body and for containing the object when the holding body is fixed on the casing.

3. The holding device of claim 2, wherein the containing recess is substantially a circular recess.

4. The holding device of claim 1, wherein the at least one tenon structure has a guiding structure for guiding the at least one tenon structure to insert into the at least one engaging slot.

5. The holding device of claim 4, wherein the guiding structure is a chamfer structure.

6. The holding device of claim 1, further comprising:
    a plurality of sliding ribs disposed on the holding body and for guiding the holding body to slide into the inserting slot.

7. The holding device of claim 6, wherein at least one engaging structure is formed on the holding body for engaging with a connector fixed inside the casing when the holding body slides into the inserting slot, so as to fix the holding body in the inserting slot.

8. An electronic device, comprising:
    a casing whereon an inserting slot and at least one engaging slot are formed; and
    a holding device, comprising:
        a holding body separately installed in the inserting slot; and
        at least one tenon structure protruding from the holding body, the at least one tenon structure being for providing a place for force to be applied, so as to activate the holding body to separate from the inserting slot, the at least one tenon structure being further for inserting into the at least one engaging slot on the casing, so as to fix and expose the holding body outside the casing for holding an object located outside the casing;
        wherein the inserting slot and the at least one engaging slot are both disposed in an interior of the casing, and the holding body is selectively disposed inside or outside of the casing.

9. The electronic device of claim 8, wherein the inserting slot is a memory card slot, and the holding body is a body of a memory card.

10. The electronic device of claim 9, further comprising:
    a locking device disposed inside the casing and for locking the casing onto a fixing object.

11. The electronic device of claim 10, wherein the locking device is a security lock whereon a locking slot corresponding to the at least one engaging slot is formed, and a contour of the at least one tenon structure substantially satisfies the locking slot.

12. The electronic device of claim 9, wherein the at least one engaging slot is a plurality of thermal holes for dissipating thermal flows inside the casing.

13. The electronic device of claim 12, wherein the holding device comprises a plurality of tenon structures for engaging with the plurality of thermal holes.

14. The electronic device of claim 8, wherein a containing recess is formed on the holding body and for containing the object when the holding body is fixed on the casing.

15. The electronic device of claim 14, wherein the containing recess is substantially a circular recess.

16. The electronic device of claim 8, wherein the at least one tenon structure has a guiding structure for guiding the at least one tenon structure to insert into the at least one engaging slot.

17. The electronic device of claim 16, wherein the guiding structure is a chamfer structure.

18. The electronic device of claim 8, wherein the holding device further comprises:
  a plurality of sliding ribs disposed on the holding body and for guiding the holding body to slide into the inserting slot.

19. The electronic device of claim 18, wherein at least one engaging structure is formed on the holding body, and the electronic device further comprises:
  a connector fixed inside the casing and for engaging with the at least one engaging structure when the holding body slides into the inserting slot, so as to fix the holding body in the inserting slot.

* * * * *